United States Patent [19]

Mitsutsuka

[11] Patent Number: 4,683,395

[45] Date of Patent: Jul. 28, 1987

[54] SURFACE ACOUSTIC WAVE DEVICE

[75] Inventor: Syuichi Mitsutsuka, Tokyo, Japan

[73] Assignee: Clarion Co., Ltd., Tokyo, Japan

[21] Appl. No.: 905,368

[22] Filed: Sep. 8, 1986

[30] Foreign Application Priority Data

Sep. 13, 1985 [JP] Japan ................................ 60-202845

[51] Int. Cl.[4] ................................ H01L 41/08

[52] U.S. Cl. ................................ 310/313 R; 310/313 D; 333/152; 364/821

[58] Field of Search ........... 310/313 R, 313 A, 313 B, 310/313 C, 313 D; 333/150–155, 193–196; 364/819, 821, 825, 604

[56] References Cited

U.S. PATENT DOCUMENTS 4,259,726 3/1981 Joly ................................ 310/313 R X
4,389,590 6/1983 Whitlock ................................ 310/313 R
4,592,009 5/1986 Masheff ................................ 310/313 R X
4,600,853 7/1986 Whitlock et al. ........... 310/313 R X
4,611,140 9/1986 Whitlock et al. ........... 310/313 R X

*Primary Examiner*—Mark O. Budd
*Attorney, Agent, or Firm*—Flynn, Thiel, Boutell, & Tanis

[57] ABSTRACT

A monolithic surface acoustic wave convolver has a structure of piezoelectric layer/insulative layer/p(n)-type semiconductive layer/n(p)-type semiconductive layer/n+(p+)-type semiconductive substrate in which the p(n)-type semiconductive layer has a uniform thickness, and its acceptor (donor) concentration and thickness are selected to allow a depletion layer to expand throughout it under zero bias. The p(n)-type semiconductive layer and n(p)-type semiconductive layer are made by epitaxially growing the n(p)-type semiconductive layer on the n+(p+)-type semiconductive substrate and subsequently change the conductivity of the surface portion of the epitaxial layer by impurity diffusion or ion implantation.

3 Claims, 5 Drawing Figures

SURFACE ACOUSTIC WAVE DEVICE

FIELD OF THE INVENTION

This invention relates to a surface acoustic wave device, and more particularly to an improvement of a monolithic surface acoustic wave convolver comprising a piezoelectric layer and a semiconductor.

BACKGROUND OF THE INVENTION

FIG. 4 is a cross-sectional view of a typical prior art monolithic surface acoustic wave convolver comprising a piezoelectric layer 1, insulative layer 2, semiconductive epitaxial layer 3, semiconductive substrate 4, gate electrode 5, bottom electrode 6, comb-shaped electrodes 7, bias voltage source 8, inductance element $L_B$ and capacitor $C_B$. Some other prior art devices do not include the insulative layer 2 and semiconductive epitaxial layer 3. In the most usual form, the piezoelectric layer is made from zinc oxide (ZnO) or aluminum nitride (AlN), the semiconductive epitaxial layer is made from silicon (Si), the insulative layer is made from silicon dioxide ($SiO_2$), and the electrodes are made of aluminum (Al) or gold (Au) film.

The role of the device is to supply an output which is a convolution signal of two input signals. In FIG. 4, when input signals $S_1$ and $S_2$ are entered in respective comb-shaped electrodes 7 via input terminals $IN_1$ and $IN_2$, an output signal $S_{OUT}$ proportional to convolution signal of the input signals $S_1$ and $S_2$ is produced at an output terminal OUT through the gate electrode 5. The magnitude of the output $S_{OUT}$ varies with a bias voltage $V_B$ applied to the gate electrode 5. FIG. 5 shows a relationship between the convolution efficiency (symbolized by $F_T$) and the bias voltage $V_B$ which relationship is expressed by:

$$S_{OUT}=F_T+S_1+S_2 \quad (1)$$

where respective values are in dBm.

The characteristic of FIG. 5 is of a device using an n-type semiconductor. When a p-type semiconductor is used, its curve is qualitatively inverted in sign of the voltage. As illustrated, the maximum efficiency is given by a value of the bias voltage which is normally several volts in the prior art devices.

With this value of the voltage, however, the semiconductor-insulator interface level or trapping at the insulator-piezoelectric interface or in the piezoelectric material would cause capture or creation of electrons or positive holes, and the time therefor would delay stabilization of the device.

OBJECT OF THE INVENTION

It is therefore an object of the invention to provide a monolithic surface acoustic wave convolver activated under no bias to eliminate the drawback in the prior art.

SUMMARY OF THE INVENTION

According to the present invention, there is provided a surface acoustic wave device comprising:

a low-resistance semiconductive substrate in a first conductivity;

a semiconductive layer in the first conductivity provided on said substrate;

a semiconductive layer in a second conductivity provided on said first conductivity semiconductive substrate;

an insulative layer provided on said second conductivity semiconductive layer;

a piezoelectric layer provided on said insulative layer;

a gate electrode provided on said piezoelectric layer;

two comb-shaped electrodes provided at both sides of said gate electrode; and a bias voltage source connected to said gate electrode, said second conductivity semiconductive layer having an impurity concentration and a thickness which allow a depletion layer to expand throughout it when a bias voltage supplied from said bias voltage source is zero.

This arrangement provides improved curves of the convolution efficiency $F_T$ and the capacitance C which are functions of the voltage where the curve of the invention device at solid lines show that the convolution efficiency $F_T$ represents the maximum and large value nearer to zero volt than the curve of the prior art device at dotted lines.

In comparison with the C-V characteristic, it is recognized that the convolution efficiency increases when the surface of the semiconductor is changed to a depletion layer or a weak inverted condition. The use of a p-type layer on the surface of an n-type semiconductor or the use of an n-type layer on the surface of a p-type semiconductor makes it possible to change the surface to a depletion layer under no bias, and hence increases the convolution efficiency $F_T$ near zero bias.

The curves of FIG. 3 are based on a structure where a p-type layer is provided on an n-type semiconductor. In a device having an n-type layer on a p-type semiconductor, the curves are qualitatively inverted in sign of the bias voltage.

DETAILED DESCRIPTION

Figure 1:
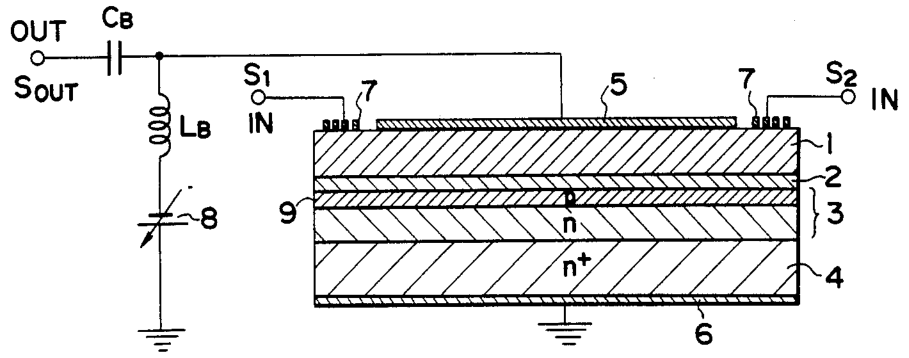
FIGS. 1 and 2 are cross-sectional views of monolithic surface acoustic wave convolver embodying the invention.
Figure 2:
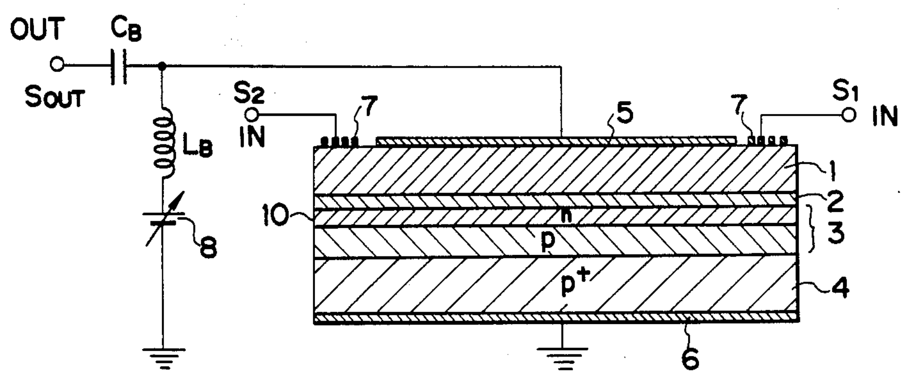
Figure 3:
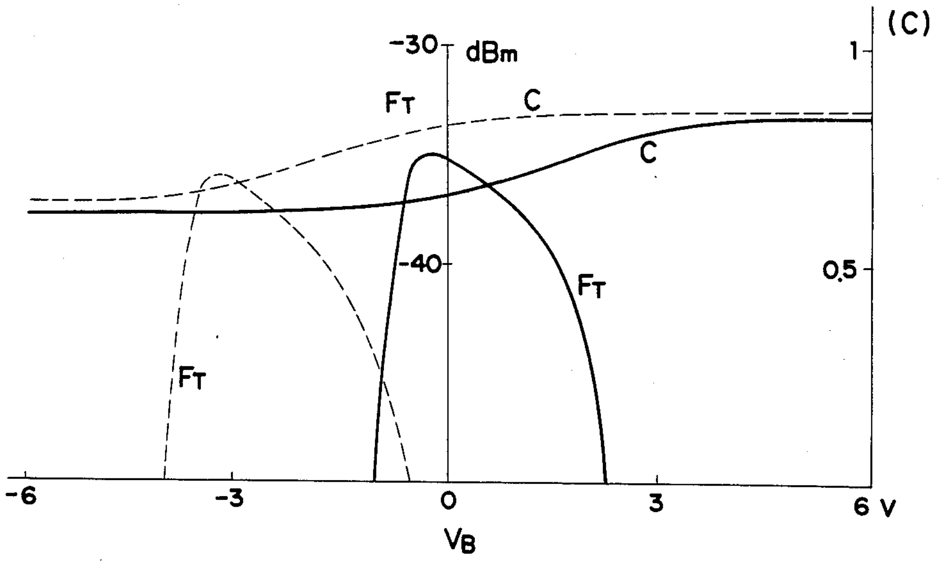
FIG. 3 shows curves of changes in the convolution efficiency and the capacitance with bias voltage in the present invention at solid lines and in the prior art at dotted lines.
Figure 4:
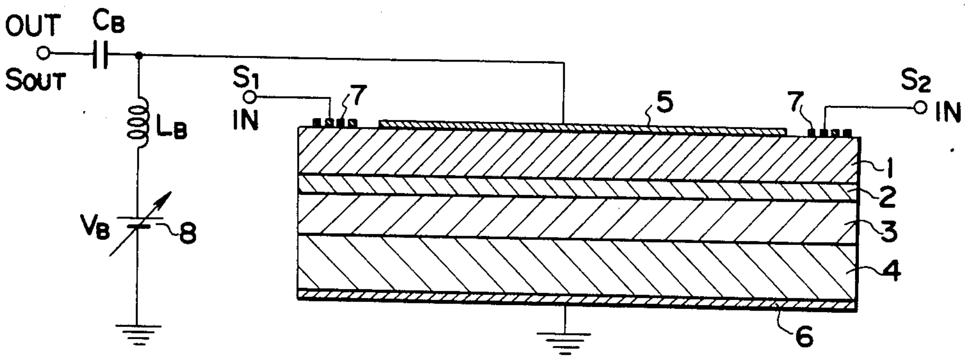
FIG. 4 PRIOR ART
FIG. 4 is a cross-sectional view of a prior art monolithic surface acoustic wave convolver.
Figure 5:
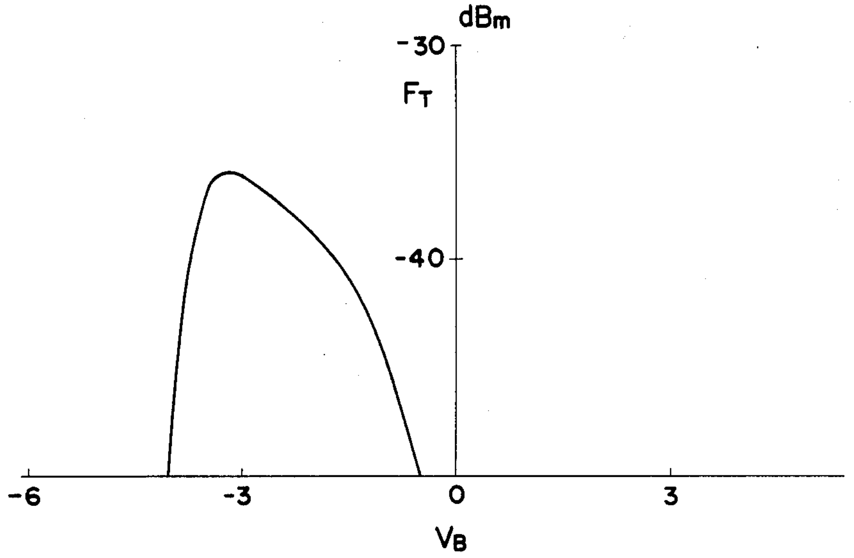
FIG. 5 shows a curve of changes in the convolution efficiency with bias voltage in the prior art convolver.

FIG. 1 shows an embodiment of the invention where an n-type epitaxial layer 3 is provided on an $n^+$-type semiconductor substrate 4, and the surface of the n-type epitaxial layer 3 is changed to a p-type semiconductive layer 9. FIG. 2 shows a further embodiment of the invention where a p-type epitaxial layer 3 is provided on a $p^+$-type semiconductive substrate 4, and the surface of the p-type epitaxial layer 3 is changed to an n-type semiconductive layer 10. In the embodiment of FIG. 1, the p-type semiconductive layer 9 on the n-type epitaxial layer 3 has an acceptor concentration and a thickness which allow a depletion layer to expand throughout itself with zero bias. Similarly in the embodiment of FIG. 2, the n-type semiconductive layer 10 on the p-type epitaxial layer 3 has a donor concentration and a thickness which allow a depletion layer to expand throughout itself with zero bias. The p-type semiconductive layer 9 of FIG. 1 and the n-type semiconductive layer 10 of FIG. 2 may be made by impurity diffusion or ion implantation.

The piezoelectric layer 1, insulative layer 2, semiconductors 3, 4, 9 and 10, electrodes 5, 6 and 7, capacitor $C_B$ and inductance element $L_B$ may be made of known suitable materials respectively. The invention device produces a signal $S_{OUT}$ proportional to a convolution signal of input signals $S_1$ and $S_2$ entered in the input terminals as in the prior art device.

As described, the invention device is activated at no bias or substantially zero bias, and effects a reliable and stable operation not affected by changes in time for activation of the device caused by capture or creation of electrons or positive holes.

The embodiments of the invention in which an exclusive property or privilege is claimed are defined as follows.

1. A surface acoustic wave device comprising:

a low-resistance semiconductive substrate in a first conductivity;

a semiconductive layer in the first conductivity provided on said substrate;

a semiconductive layer in a second conductivity provided on said first conductivity semiconductive substrate;

an insulative layer provided on said second conductivity semiconductive layer;

a piezoelectric layer provided on said insulative layer;

a gate electrode provided on said piezoelectric layer;

two comb-shaped electrodes provided on opposite sides of said gate electrode; and a bias voltage source connected to said gate electrode, said second conductivity semiconductive layer having an impurity concentration and a thickness which allow a depletion layer to expand throughout it when a bias voltage supplied from said bias voltage source is zero.

2. A surface acoustic wave device of claim 1 wherein said substrate is an $n^+$-type semiconductor, said first conductivity semiconductive layer is an n-type semiconductive epitaxial layer, and said second conductivity semiconductive layer is the surface of said epitaxial layer changed to a p-type semiconductive layer.

3. A surface acoustic wave device of claim 2 wherein said substrate is a $p^+$-type semiconductor, said first conductivity semiconductive layer is a p-type semiconductive epitaxial layer, and said second conductivity semiconductive layer is the surface of said epitaxial layer changed to an n-type semiconductive layer.

* * * * *

UNITED STATES PATENT AND TRADEMARK OFFICE

CERTIFICATE OF CORRECTION

PATENT NO. : 4 683 395

DATED : July 28, 1987

INVENTOR(S) : Syuichi MITSUTSUKA

It is certified that error appears in the above-identified patent and that said Letters Patent is hereby corrected as shown below:

Column 4, line 20; change "2" to ---1---.

Signed and Sealed this

Fourth Day of August, 1992

*Attest:*

DOUGLAS B. COMER

*Attesting Officer* — *Acting Commissioner of Patents and Trademarks*